June 2, 1964 R. R. BOCKEMUEHL 3,135,926

COMPOSITE FIELD EFFECT TRANSISTOR

Filed Sept. 19, 1960

INVENTOR.
Robert R. Bockemuehl
BY
Robert E. Fowler
ATTORNEY 3,135,926

COMPOSITE FIELD EFFECT TRANSISTOR

Robert R. Bockemuehl, Birmingham, Mich., assignor to General Motors Corporation, Detroit, Mich., a corporation of Delaware Filed Sept. 19, 1960, Ser. No. 56,887
3 Claims. (Cl. 330—38)

This invention relates to a composite semiconductor device having unitary construction but multiple element function. It relates to a type of semiconductor device that may in different areas of a crystalline body perform the functions of a light or radiant energy sensitive transducer and in another section or area provide amplifying means for the voltages or currents presented thereto.

In general the type of device under consideration is that known as a field effect transistor and while not limited to such a material may be fabricated of cadmium sulfide. Such devices are usually fabricated of a single slab of semiconductor material having ohmic contacts on opposite ends, one of which is identified as a source electrode and the other as the drain electrode depending upon direction of current flow. Around the central part of the semiconductor body there is provided a rectifier or diodic contact which is known as a gate electrode. Current flows through the body from the drain to the source and such flow is controlled by voltage applied to the gate electrode. In some instances where the semiconductive material is also photosensitive, which would be the case with cadmium sulfide which is sensitive to radiation of certain wave lengths, the intensity of incident rays falling on the body also regulates or affects the current flow. A field effect transistor of photoconductive material is inherently a constant current device and its output current is relatively independent of output voltage but does depend almost entirely on the amount of incident radiation and gate electrode voltage. This type of device necessarily operates into a large output impedance in order to obtain maximum voltage gain.

It is an object in making this invention to provide a unitary body having separate characteristic multi-element circuits therein.

It is a further object in making this invention to provide a unitary body comprising both a photosensitive semiconductor and separate matching impedance load therefor to provide a maximum voltage gain.

It is a still further object in making my invention to provide a composite field effect cadmium sulfide photosensitive transistor in which a high impedance load is an integral part to provide maximum voltage gain.

It is a still further object in making my invention to produce a composite semiconductor body having a plurality of separate conductive paths therethrough providing a field effect transistor, a high impedance load therefor and a current amplifying section.

With these and other objects in view which will become apparent as the specification proceeds, my invention will be best understood by reference to the following specification and claims in the illustrations in the accompanying drawings in which:

Figure 4:
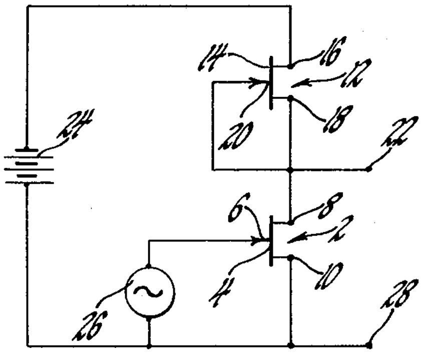
FIG. 4 is a circuit diagram illustrating the basic principle of combining multiple element circuits in the single unit of a composite transistor; and, FIG. 5 is a current-voltage graph illustrating the increase in output voltage achieved by a relatively small change in input signal either through incident radiation intensity or gate voltage.

Cadmium sulfide field effect transistors require high impedance loads in order to obtain maximum voltage gain. Referring specifically to FIG. 4 a field effect transistor 2 is shown in the lower righthand corner. Such a transistor is essentially a resistance whose value is a function of the applied transverse field. It is represented schematically as a body 4 and gate electrode 6, a drain electrode 8 and a source electrode 10. These last two electrodes are actually ohmic contacts on the ends of a cadmium sulfide slab. Therefore, the flow of current through the main body 4 in this instance is opposite from the electron flow or from the drain electrode 8 to the source electrode 10 and is controlled by the voltage on the gate 6. Since a field effect transistor of this type requires a high impedance in the output circuit in order to obtain maximum voltage gain, a second transistor having high impedance would be a natural device to use for this purpose as the value would be within the proper range.

Figure 5:
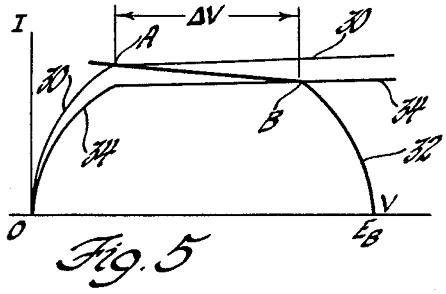

The effect of this can best be explained with the aid of the EI graph FIG. 5. Assume that a simple field effect transistor such as 2 just described is connected across a source of voltage and the gate electrode 6 grounded. Then as voltage applied $E_B$ is increased the curve 30 will be plotted of current change. This curve proceeds upwardly and then breaks over at a knee point A and finally gradually increases slowly in linear relation from that point on. If a bias voltage is applied to the gate 6 or if the fixed radiant energy allowed to fall on the transistor 2 is decreased and the application of voltage $E_B$ repeated from zero to more finite values then the curve 34 would be produced. It is desired to obtain as large a voltage change in the output circuit as possible by any input signal. Thus by utilizing a high impedance load in series with the field effect transistor the curve 32 is obtained of current flow through the impedance as the current flows through the transistor. It is obvious that the current change along curve 32 from point A to point B due to a difference in signal strength on the gate will cause a voltage change $\Delta V$ as indicated, which is large. This illustrates a large voltage gain and why high impedance loads produce such high voltage gain in a field effect transistor output circuit.

FIG. 4 illustrates the use of a second field effect transistor 12 as a high impedance load for the main amplifying transistor to provide the desired results. The load transistor consists of the main body 14 with its drain electrode 16 and source electrode 18 connected directly in series with the first. In the total circuitry, the gate 20 of the second transistor is shown connected directly to both the source electrode 18 and drain electrode 8 of transistors 12 and 2 respectively and to an output terminal 22. A source of electrical power for the two transistors is diagrammatically shown as a battery 24 which has one terminal connected to the drain electrode 16 of transistor 12 and the opposite terminal connected to the source electrode 10 of transistor 2. The input to transistor 2 may be any type of signal device and this is shown simply as an oscillator 26 connected between the source and gate electrodes 10 and 6, respectively, of transistor 2. The remaining output electrode 28 is connected to the source electrode 10. The voltage of the battery 24 must equal at least the sum of the pinch off voltages of the two transistors 2 and 12, plus the desired signal voltage swing. When the signal voltage is applied to the gate 6 it modulates the flow of current through the transistor 2 and since the transistor 12 is in series therewith the current flow through that transistor will be similarly modulated to produce an amplified output voltage appearing across terminals 22 and 28.

Figure 3:
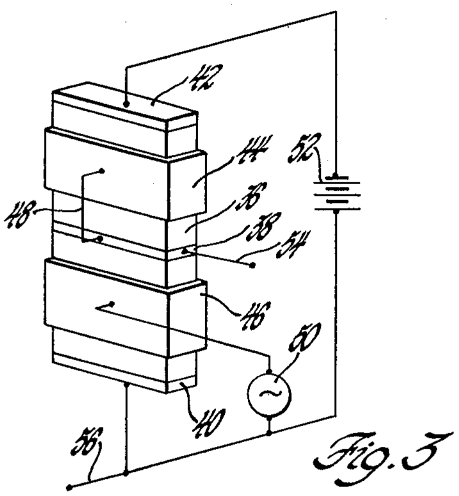
FIG. 3 is a perspective view of a simpler version of a composite field effect phototransistor including only a field effect transistor and matching impedance load therefor embodying my invention.

Rather than actually physically using two field effect transistors electrically connected in series both circuits can be incorporated in a single unitary device such as that shown in FIG. 3. In this device a single slab or body of semiconductive material 36 is originally provided around the center of which is secured an ohmic band contact 38. This acts as the source electrode for an upper transistor section and a drain electrode for a lower transistor section. Secured to the bottom face of the semiconductor body or wafer 36 is an ohmic electrode 40 which acts as the source electrode for the lower transistor section and in like manner an ohmic contact area 42 is plated or otherwise secured to the upper end of the semiconductor slab 36 to act as the train electrode for the upper transistor section. Through these three connections, therefore, there is provided a source and drain electrode connection for two different transistor sections of a single unitary semiconductor slab defining two different separate and distinct transistor areas therein which can be used as suggested in FIG. 4. Around the upper portion of the semiconductor slab 36 there is alloyed or diffused a band or rectifier contact 44 providing a gate electrode for the upper transistor section which has blocking or barrier contact with the semiconductor surface. In similar manner a second barrier electrode 46 is formed around the lower half of the wafer 36 to provide a gate 46 for the second transistor section.

This whole unitary construction with the described ohmic and diodic contacts on the surface, therefore, provides all of the elements previously discussed with regard to the circuit diagram of FIG. 4. They may be connected together in the following manner to provide the same circuitry. A conductor 48 is connected between gate 44 and the source-drain ohmic contact 38. A source of signal pulses 50 is connected directly to the input gate 46 and a source of electrical power 52 is connected directly across the upper and lower ohmic contacts 40 and 42. This provides the signal and power input. The output is taken from lines 54 and 56 connected to the ohmic source-drain contacts 38 and 40, respectively. By comparison it will be clear that all of the parts of the circuit described in FIG. 4 will be found in the composite body and electrical connections shown in FIG. 3. As a result there is obtained a composite field effect transistor together with a matching impedance load to provide a high voltage gain amplifier all in a single package.

Figure 1:
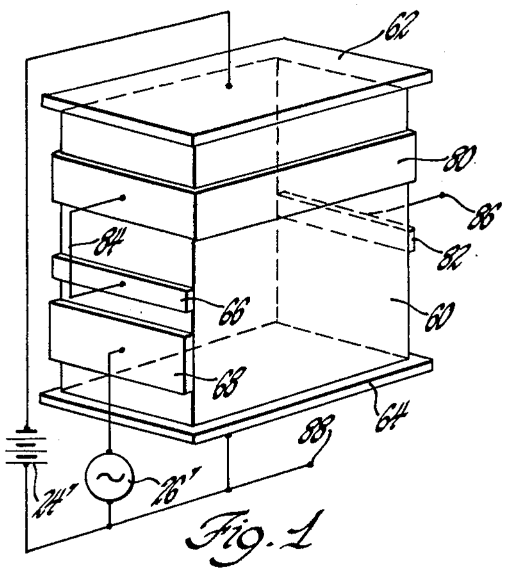
FIGURE 1 is a perspective view of a composite field effect phototransistor including a voltage amplifier section with a high impedance load section and a current amplifier section embodying my invention.

In addition to the high voltage gain amplifier provided by the structure shown in FIG. 3 it may also be necessary to provide for current amplification since this is inherently a high impedance device. This can be obtained by an additional field effect transistor connected in a common drain circuit. Such a structure is shown circuit-wise in FIG. 2 and structurally in FIG. 1. The structure of FIG. 3 provides a single series conductive path through the semiconductor body providing different functions at different longitudinal locations along the path. The device of FIG. 1 has a plurality of parallel paths therethrough from one end to the other which are kept separate due to the insulating characteristics of the material. The current paths are made conductive by the addition of impurities to the required regions.

The realization of multiple current paths which do not interact is made possible by the utilization of high energy gap semiconductors. For example, the energy required to liberate an electron from a valence state to the conduction band in cadmium sulfide is sufficiently great to preclude thermal generation of carriers. Therefore cadmium sulfide is an insulator in the dark at room temperature. Such materials can be made conductive by the addition of impurities which can be ionized at room temperature or by illumination which generates carriers photoelectrically.

If a device of the type described herein is to operate in the dark, donor impurities, such for example as indium, must be diffused a short distance into the surface in regions which are to be conductive. These conductive regions are isolated from one another by the regions of higher purity which separate them. Or, if the device is to operate as a photosensitive transistor, the photoconductive regions of a relatively pure crystal can be formed by shallow diffusion of an impurity, such for example as a combination of copper and indium, which greatly increases the photosensitivity of the material. The photoconductive regions are isolated by regions having much less photoconductivity. This isolation can be further increased by addition of impurities, such as copper alone, which increase electron-hole recombination in the isolation regions of the device.

Figure 2:
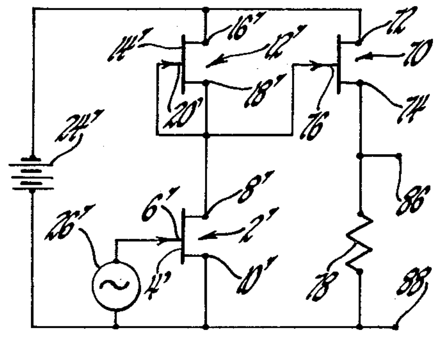
FIG. 2 is a circuit diagram illustrating the various electrical circuits contained in the composite phototransistor of FIG. 1.

First discussing the circuit features and referring particularly to FIG. 2 it will be noted that the lefthand side of FIG. 2 is exactly the same as FIG. 4 showing two field effect transistors in series across a source of electrical power and provided by any suitable signal input. Therefore, the same reference characters have been used to identify the parts except the numerals have been primed. Thus there is a first series circuit of transistors 12' and 2' in series across a source of electrical power 24'. An input signal 26' is applied to gate 6' of the field effect transistor 2'. This series circuit is physically provided through the lefthand side of the semiconductor slab 60 of FIG. 1. On the top of the slab 60 is an ohmic contact layer 62 which acts as the drain electrode 16' of the transistor 12'. On the lower face of the slab 60 is a similar ohmic contact layer 64 which acts as the source electrode 10' of the transistor 2'. An ohmic contact bar 66 is applied across the left end of slab 60 midway between the top and bottom to simultaneously act as the drain electrode 8' of the lower transistor 2' and the source electrode 18' of the upper transistor 12'. A barrier electrode 68 is applied to the left end between ohmic bar 66 and the lower end and this acts as gate 6' of the transistor 2'. Around the upper portion of the slab 60 there extends a band 80 with barrier contact to the semiconductor body. This member extends entirely around the slab and on the left end acts as the gate electrode 20' of the transistor 12'. Thus there is provided through the lefthand side of the slab 60 a series conductive path forming two field effect transistors such as 2' and 12'. This provides a high voltage gain amplifier circuit such as that previously discussed in FIGS. 3 and 4.

Since the output impedance of this first section is quite high it may be desirable to provide current amplification for some applications. This can be obtained by the use of an additional field effect transistor connected in a common drain circuit. This is shown in FIG. 2 as the transistor 70 having a drain electrode 72, a source electrode 74 and a gate electrode 76. This transistor 70 is connected in series with a resistance 78 across which the output signal is developed. This conductive series circuit is provided through the righthand side of the semiconductor slab 60. Again the ohmic end contact 62 performs the function of the drain electrode 72 of the transistor 70. The barrier electrode 80 which extends entirely around the slab 60 acts as the gate 76 of the transistor and performs the added functions of conductively connecting the two gates 20' and 76. Across the rear face of the slab 60 and shown in dotted lines is an ohmic bar contact 82 which acts as a source electrode 74 of the transistor 70 and also one terminal of the resistance 78. Resistance 78 is the actual resistance of the conductive path through the slab from the ohmic contact 82 to the ohmic contact 64. Thus by adding a single external connection 84 between barrier electrode 80 and ohmic plate 66 a composite multipath circuit is provided through the single semiconductor slab. By adding a power supply 24' connected across the ohmic end plates 62 and 64 and a signal input 26' between barrier electrode 68 and ohmic end plate 64 an amplified usable signal is developed across output terminals 86—88 that is both voltage and current amplified.

What is claimed is:

1. In semiconductor means, an elongated body of cadmium sulfide having an ohmic contact area on each end, a central band ohmic contact around the center of the body, a pair of barrier electrode bands around the body, one between the central band ohmic contact and each end to form in effect a pair of field effect transistors in series circuit relation in the unitary body, a source of electrical power connected across said ohmic contact areas on the ends of the elongated body of cadmium sulfide, an input circuit connected to one end ohmic contact area and to one barrier electrode band, an output circuit connected to the same end ohmic contact area and to the central band ohmic contact and a conductive connection between the central band ohmic contact and the other barrier electrode band to form a first amplifying field effect transistor and a matching impedance load in series therewith as a unitary body.

2. In a composite semiconductor, a cadmium sulfide body having two ends and at least two side faces, ohmic contact areas covering the ends of the cadmium sulfide body, a bar ohmic electrode on each of the opposite side faces between the ends, said ohmic contact areas and electrodes providing source and drain electrodes for field effect transistor sections created in the body, a barrier contact band formed around the upper portion of the body and providing gate electrodes for a pair of field effect transistors said barrier contact band further conductively connecting said gate electrodes together and a bar barrier contact on one end forming a gate electrode for a third field effect transistor section so that the cadmium sulfide body with its ohmic and barrier contacts forms an amplifying field effect transistor with a high impedance load and a common drain current amplifying means therefor.

3. In semiconductor means, an elongated body of material having energy gap characteristics sufficiently high to preclude thermal generation of carriers, said body including two ends and at least two faces interconnecting said ends, an ohmic contact area on each end, a central ohmic contact secured to and extending transversely across at least one of said faces at a point intermediate the ends, a pair of rectifying barriers formed by impurity concentration surface areas secured to and extending transversely across said one face of the body, one between each end and the central ohmic contact area forming two transistor sections in series, said ohmic contact areas forming source and drain electrodes for the two transistor sections and the rectifying barrier contacts forming gate electrodes for the same, said central ohmic contact area forming a common drain contact for one and source contact for the other transistor section, an input circuit connected to one end ohmic contact area and to one rectifying barrier contact, an output circuit connected to the same end ohmic contact area and to the central ohmic contact area, and a conductive connection between the central ohmic contact area and the second barrier contact to form a first amplifying field effect transistor and a matching impedance load in series therewith as a unitary body.

References Cited in the file of this patent

UNITED STATES PATENTS

| | | |
|---|---|---|
| 2,648,805 | Spenke | Aug. 11, 1953 |
| 2,730,576 | Caruthers | Jan. 10, 1956 |
| 2,778,956 | Dacey | Jan. 22, 1957 |
| 2,801,346 | Rongen | July 30, 1957 |
| 2,836,797 | Ozarow | May 27, 1958 |
| 2,951,191 | Herzog | Aug. 30, 1960 |

OTHER REFERENCES

Shea: Principles of Transistor Circuits, page 477, FIG. 21.38, pub. 1953 by Wiley & Sons, New York.

Dacey and Ross: Unipolar Feld Effect Transistors, Pro. IRE, August 1953, pages 970–979.

Wallmark et al.: RCA Engineer, vol. 5, No. 1, June 1959, pages 42–45.